(12) United States Patent
Ren

(10) Patent No.: US 10,824,038 B2
(45) Date of Patent: Nov. 3, 2020

(54) ARRAY SUBSTRATE, DISPLAY PANEL AND DISPLAY DEVICE

(71) Applicant: Shenzhen China Star Optoelectronics Semiconductor Display Technology Co., Ltd., Shenzhen (CN)

(72) Inventor: Wei Ren, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 48 days.

(21) Appl. No.: 16/235,458

(22) Filed: Dec. 28, 2018

(65) Prior Publication Data

US 2020/0004092 A1 Jan. 2, 2020

Related U.S. Application Data

(63) Continuation of application No. PCT/CN2018/096923, filed on Jul. 25, 2018.

(30) Foreign Application Priority Data

Jun. 27, 2018 (CN) .......................... 2018 1 0680920

(51) Int. Cl.
*G02F 1/1362* (2006.01)
*G02F 1/1337* (2006.01)

(52) U.S. Cl.
CPC ...... *G02F 1/136286* (2013.01); *G02F 1/1337* (2013.01); *G02F 2001/13629* (2013.01); *G02F 2201/123* (2013.01)

(58) Field of Classification Search
None
See application file for complete search history.

(56) References Cited

U.S. PATENT DOCUMENTS

2008/0123004 A1  5/2008  Lin et al.
2010/0045886 A1  2/2010  Kwak
(Continued)

FOREIGN PATENT DOCUMENTS

CN   103760693 A   4/2014
CN   103995370 A   8/2014
(Continued)

OTHER PUBLICATIONS

First Office Action from China Patent Office in a counterpart Chinese Patent Application 201810680920.0, dated Apr. 26, 2020, 17 pages.

*Primary Examiner* — Steven M Christopher
(74) *Attorney, Agent, or Firm* — Brinks Gilson & Lione

(57) ABSTRACT

An array substrate, a display panel, and a display device are disclosed. The array substrate includes a display region and a non-display region, the non-display region includes a plurality of alignment wires and a plurality of alignment pads; wherein each alignment pad electrically connects to a corresponding alignment wire, and the high potential alignment wire electrically connects to the high potential pad and the low potential alignment wire electrically connects to the low potential pad, the high potential alignment wire is disposed on one side of the plurality of alignment pads and the low potential alignment wire is disposed on an opposite side of the plurality of alignment pads. In the above manner, the present disclosure can reduce the risk of generating static electricity between the alignment wires and improve the electrostatic protection capability of the product.

18 Claims, 5 Drawing Sheets

(56) References Cited

U.S. PATENT DOCUMENTS

| | | |
|---|---|---|
| 2013/0143463 A1 | 6/2013 | Park et al. |
| 2015/0179666 A1 | 6/2015 | Chai |
| 2016/0062161 A1* | 3/2016 | Lee .................. H01L 27/124 349/40 |
| 2018/0196295 A1* | 7/2018 | Xing .................. G09G 3/3677 |
| 2019/0064573 A1 | 2/2019 | Peng |
| 2019/0113794 A1 | 4/2019 | Song |

FOREIGN PATENT DOCUMENTS

| | | |
|---|---|---|
| CN | 104407456 A | 3/2015 |
| CN | 105842897 A | 8/2016 |
| CN | 106547155 A | 3/2017 |
| CN | 106932981 A | 7/2017 |
| CN | 107037637 A | 8/2017 |
| CN | 107093391 A | 8/2017 |
| CN | 206863434 U | 1/2018 |
| CN | 107664892 A | 2/2018 |
| CN | 107942587 A | 4/2018 |
| CN | 207366904 U | 5/2018 |

\* cited by examiner

ARRAY SUBSTRATE, DISPLAY PANEL AND DISPLAY DEVICE

CROSS-REFERENCE TO RELATED APPLICATIONS

The present application is a continuation-application of International (PCT) Patent Application No. PCT/CN2018/096923, filed on Jul. 25, 2018, which claims foreign priority of Chinese Patent Application No. 201810680920.0, filed on Jun. 27, 2018 in the National Intellectual Property Administration of China, the entire contents of which are hereby incorporated by reference.

TECHNICAL FIELD

Embodiments of the present disclosure generally relate to the field of display technologies, and in particular, to an array substrate, a display panel, and a display device.

BACKGROUND

With the development of electronic technology, electronic products are gradually becoming light, thin, short and micro-sized, with the internal electronic components constantly miniaturized, and the integration of integrated circuits continuously improved, thus causing the shrinking diameter of the unit wires, and resistance to static electricity, and electrostatic discharge is accordingly getting worse and worse, and the electrostatic sensitivity is getting higher and higher. The electrostatic discharge has become the main cause of device failure, low passing rate of finished products and early failure in the electronics industry, which seriously affects product first pass yield, quality stability and reliability, and adversely affects manufacturers' production costs and reputation.

In the current TFT-LCD display panel on the market, a vertically aligned (VA) type liquid crystal display panel has a very wide application in a large-sized display such as a television because of its extremely high contrast. The High Vertically Aligned (HVA) mode is one important branch of the VA modes. When the HVA liquid crystal display panel operates, the vertical electric field formed by the pixel electrode on the side of the array substrate and the common electrode on the side of a color film substrate controls the rotation of the liquid crystal molecules of the liquid crystal layer.

When the VA mode liquid crystal display panel is aligned by means of polymer stable alignment, it is necessary to apply a predetermined curing voltage to the liquid crystal layer, and at this voltage, the reactive monomer in the liquid crystal layer is polymerized and cured through light irradiation. Thereby, a polymer layer is simultaneously formed on the substrates on both sides of the liquid crystal layer, so that the liquid crystal cell generates a certain deflection angle, thereby completing light alignment process of the liquid crystal.

In light alignment process of the liquid crystal, it is necessary to previously form a light alignment wire around the liquid crystal display panel to realize an application operation of the predetermined curing voltage or the like. When there are many alignment wires, it is prone to cause cross-line cases, and electrostatic discharge is likely to happen at the cross-line region, which causes the wire to be damaged, thereby affecting the alignment of the liquid crystal display panel.

Referring to FIG. 1 to FIG. 4, FIG. 1 is a schematic diagram of a peripheral alignment wire of an array substrate in related art, and FIG. 2 to FIG. 4 are schematic diagrams showing the effect of electrostatic short circuit of a peripheral alignment wire of an array substrate in related art. Each set of alignment pads includes a color film substrate common voltage pad CF-com configured to input a common voltage of the color film substrate, an array substrate common voltage pad A-com configured to input an array substrate common voltage, n clock pads CK1, CK2, CK3, CK4, CK5, CK6, . . . CKn configured to input a clock signal, clock pads LC1, LC2 configured to input low frequency clock signal, a start signal pad ST configured to input the start signal, a common voltage pad Vss configured to input a common terminal voltage, and data signal voltage pads R, G, B configured to input a pixel electrode data signal voltage. The alignment wiring region is provided with a first metal layer M1, an insulating layer AS, and a second metal layer M2. Each set of alignment wires is divided into a main wire (1101, 1201, etc.) and a connection wire (1202, etc.), and the main wire (1101, 1201, etc.) is disposed on the first metal layer M1, and the connection wire (1202, etc.) is disposed on the second metal layer M2. The first metal layer M1 and the second metal layer M2 are separated by the insulating layer AS, and the wires of the first metal layer M1 and that of the second metal layer M2 are electrically connected through through-holes of the insulating layer AS.

When performing liquid crystal alignment, the pad CF-com is configured to access a high potential signal (H), while the pad A-com, the clock pads CK1, CK2, CK3, CK4, CK5, CK6, . . . CKn, the low frequency clock pads LC1, LC2, the start signal pad ST, the common voltage pad Vss, and the data signal voltage pads R, G, B are configured to access a low potential signal (L). And when the connection wire (1202, etc.) crosses the main wire 1101, since the potential signal difference at the cross-line region A is large, electrostatic discharge (ESD) is easily generated. As shown in FIG. 2, the generation of electrostatic discharge may cause the short circuit of the pad CF-com and other pads to be short-circuited. The short circuit may cause the high potential signal that loads the CF-com to be pulled down, further to cause the liquid crystal to fail to sense the voltage difference required for the alignment, thus causing the liquid crystal alignment to be abnormal. As shown in FIG. 3, there are generally two types of cross-line regions prone to generate electrostatic short circuit, one is a cross-line region between a connection wire 3102 of a pad CF-com having a high potential and the main wires 3201, 3301, 3401 and 3501 of other pads having a low potential (as shown in FIG. 3a), and the other is a cross-line region between a main wire 3101 of the pad CF-com having a high potential and the connection wires 3202, 3302 etc. of other pads having a low potential (as shown in FIG. 3b).

In the long-term research and development process, the inventors of the present disclosure found that in the field of liquid crystal display (LCD), the array substrate using the gate driver on array (GOA) technology has an obviously larger number of peripheral signal wires than the non-GOA products, the cross-line region is also correspondingly increased, and the cross-line region is prone to generate electrostatic discharge, and the risk of generating electrostatic discharge will also increase, so it is necessary to improve the electrostatic protection capability of the product.

SUMMARY

The technical problem to be solved by the present disclosure is to provide an array substrate, a display panel, and a display device, which can reduce the risk of generating static electricity between the alignment wires and improve the electrostatic protection capability of the product.

In order to solve the above technical problem, one technical solution adopted by the present disclosure is to provide an array substrate including a display region and a non-display region, the non-display region includes a plurality of alignment wires divorced into a high potential alignment wire and a low potential alignment wire; a plurality of alignment pads grouped into a high potential pad and a low potential pad; wherein each alignment pad electrically connects to a corresponding alignment wire, and the high potential alignment wire electrically connects to the high potential pad and the low potential alignment wire electrically connects to the low potential pad, the high potential alignment wire is disposed on one side of the plurality of alignment pads and the low potential alignment wire is disposed on an opposite side of the plurality of alignment pads; and the high potential alignment wire has a first orthogonal projection on the plurality of alignment pads, the low potential alignment wire has a second orthogonal projection on the plurality of alignment pads, and the first orthographic projection and the second orthographic projection do not overlap with each other; and when the number of the high potential alignment wires is smaller than the number of the low potential alignment wires, the high potential alignment wire is disposed farther from the display region than the low potential alignment wire; and when the number of the high potential alignment wires is greater than the number of the low potential alignment wires, the high potential alignment wire is disposed more closely to the display region than the low potential alignment wire is disposed.

In order to solve the above technical problem, a technical solution adopted by the present disclosure is to provide an array substrate, the array substrate includes a display region and a non-display region, the non-display region includes a plurality of alignment wires divorced into a high potential alignment wire and a low potential alignment wire; a plurality of alignment pads grouped into a high potential pad and a low potential pad; wherein each alignment pad electrically connects to a corresponding alignment wire, and the high potential alignment wire electrically connects to the high potential pad and the low potential alignment wire electrically connects to the low potential pad, the high potential alignment wire is disposed on one side of the plurality of alignment pads and the low potential alignment wire is disposed on an opposite side of the plurality of alignment pads.

In order to solve the above technical problem, another technical solution adopted by the present disclosure is to provide a display panel, the display panel including an array substrate, the array substrate including a display region and a non-display region, the non-display region includes a plurality of alignment wires divorced into a high potential alignment wire and a low potential alignment wire; a plurality of alignment pads grouped into a high potential pad and a low potential pad; wherein each alignment pad electrically connects to a corresponding alignment wire, and the high potential alignment wire electrically connects to the high potential pad and the low potential alignment wire electrically connects to the low potential pad, the high potential alignment wire is disposed on one side of the plurality of alignment pads and the low potential alignment wire is disposed on an opposite side of the plurality of alignment pads.

In order to solve the above technical problem, a further technical solution adopted by the present disclosure is to provide a display device, the display device includes a display panel, and the display panel includes an array substrate. The array substrate includes a display region and a non-display region, the non-display region includes a plurality of alignment wires divorced into a high potential alignment wire and a low potential alignment wire; a plurality of alignment pads grouped into a high potential pad and a low potential pad; wherein each alignment pad electrically connects to a corresponding alignment wire, and the high potential alignment wire electrically connects to the high potential pad and the low potential alignment wire electrically connects to the low potential pad, the high potential alignment wire is disposed on one side of the plurality of alignment pads and the low potential alignment wire is disposed on an opposite side of the plurality of alignment pads.

The beneficial effects of the present disclosure are as follows. Different from the prior art, in the array substrate provided by the present disclosure, by partitioning the alignment wires according to the potential level, the alignment wires with similar potential can be configures in the same region, thereby avoiding the cross-line region with huge potential difference, further preventing electrostatic short circuit and improving the electrostatic protection capability of the product.

DETAILED DESCRIPTION

In order to make the objectives, technical solutions and effects of the present disclosure more clear and definite, the present disclosure will be further described in detail below with reference to the accompanying drawings and in conjunction with embodiments.

Figure 1:
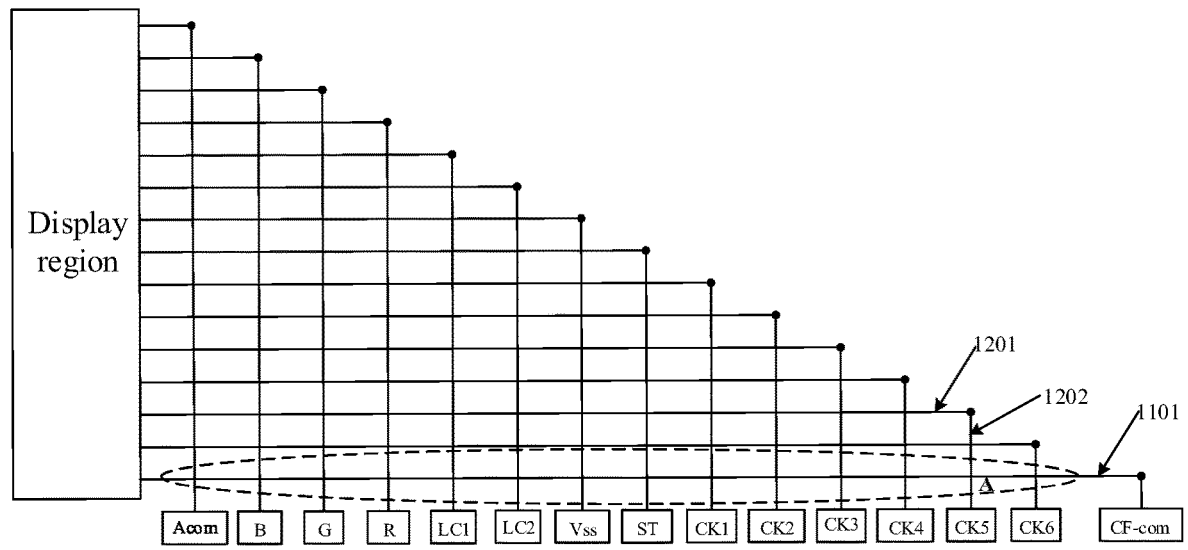
FIG. 1 is a schematic diagram of a peripheral alignment wiring of an array substrate in the prior art.
Figure 2:
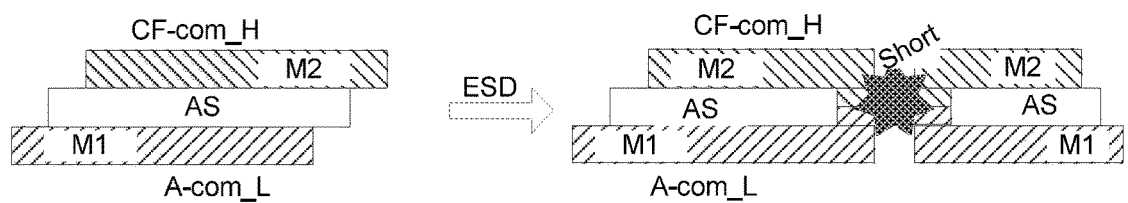
FIG. 2 is a schematic diagram illustrating an effect of an electrostatic short circuit of a peripheral alignment wire of an array substrate in the prior art.
Figure 3:
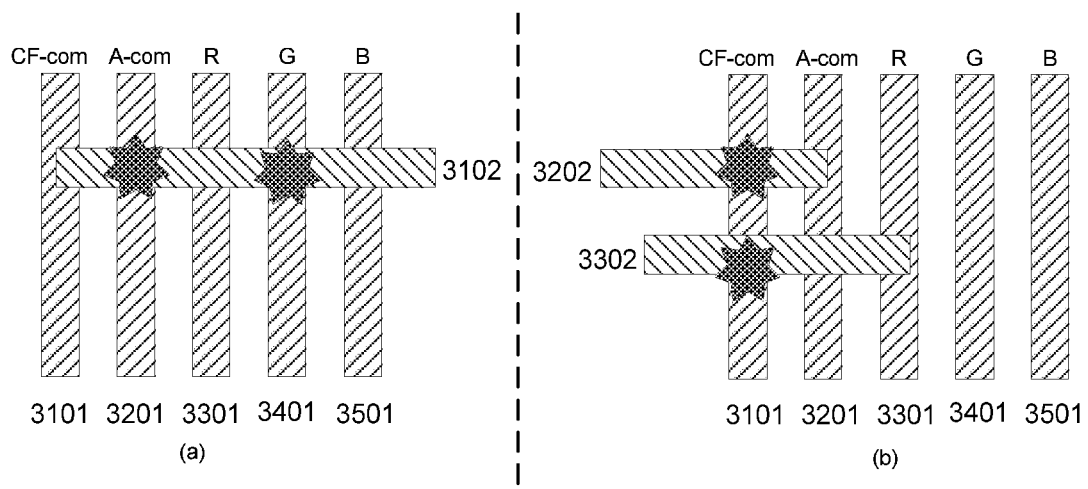
FIG. 3 is a schematic diagram illustrating an effect of an electrostatic short circuit of a peripheral alignment wire of an array substrate in related the prior art.
Figure 4:
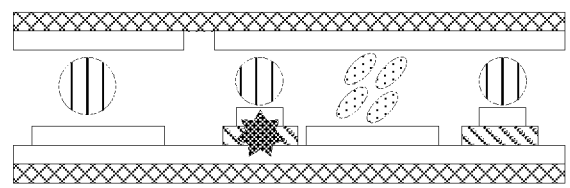
FIG. 4 is a schematic diagram illustrating an effect of an electrostatic short circuit of a peripheral alignment wire of an array substrate in related the prior art.
Figure 5:
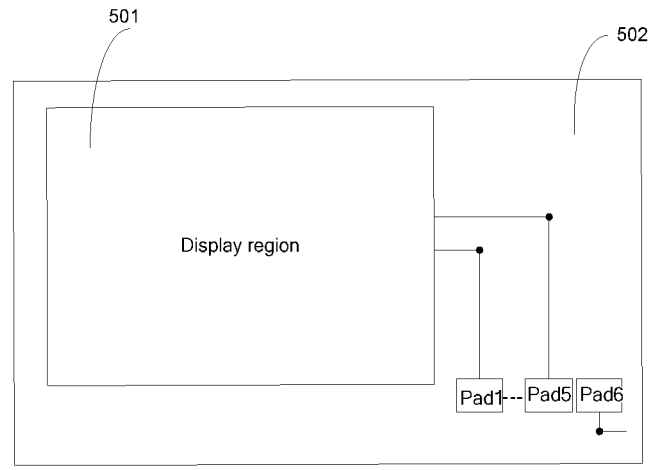
FIG. 5 is a schematic diagram of a first embodiment of an array substrate of the present disclosure.
Figure 6:
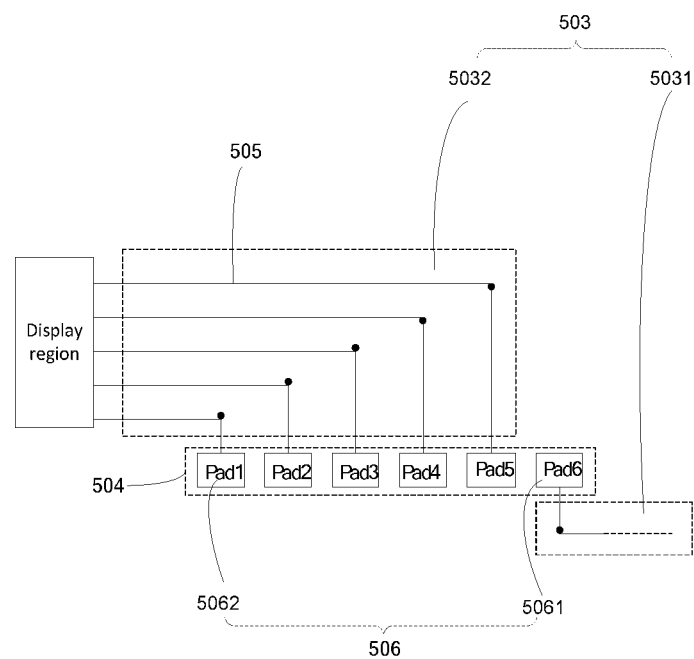
FIG. 6 is a schematic diagram illustrating the alignment wire of a non-display region in FIG. 5.

The present disclosure provides an array substrate. Referring to FIG. 5 to FIG. 6, FIG. 5 is a schematic diagram of a first embodiment of the array substrate of the present disclosure, and FIG. 6 is a schematic diagram of an alignment wire of a non-display region of FIG. 5. In this embodiment, the array substrate 50 may include a display region 501 and a non-display region 502. The non-display region 502 may include an alignment wiring region 503 and an alignment pad region 504. The alignment wiring region 503 may be provided with a plurality of alignment wires 505 and including a high potential wiring region 5031 and a low potential wiring region 5032. And the alignment pad region 504 may be provided with a plurality of alignment pads 506 grouped into a high potential pad 5061 and a low potential pad 5062. And each alignment pad 506 electrically connects to a corresponding alignment wire 505. The high potential wiring region 5031 may be disposed on one side of the alignment pad region 504, and the low potential wiring region 5032 may be located on an opposite side of the alignment pad region 504. The alignment wire 505 corresponding to the high potential pad 5061 can be disposed in the high potential wiring region 5031, and the alignment wire 505 corresponding to the low potential pad 5062 can be disposed in the low potential wiring region 5032. By partitioning the alignment wires 505 according to the potential level, the alignment wires 505 with similar potentials can be disposed in the same region to avoid the cross-line region with a large potential difference being generated, which can decrease electrostatic short circuits and improve the electrostatic protection capability of the product.

Alternatively, in one embodiment, when depositing the alignment wire, the alignment wire in the high potential wiring region has a first orthogonal projection on the alignment pad region, the alignment wire in the low potential wiring region has a second orthographic projection on the alignment pad region, and the first orthographic projection and the second orthographic projection may not overlap with each other. In this way, the amount of the cross-line region can be minimized.

Figure 7:
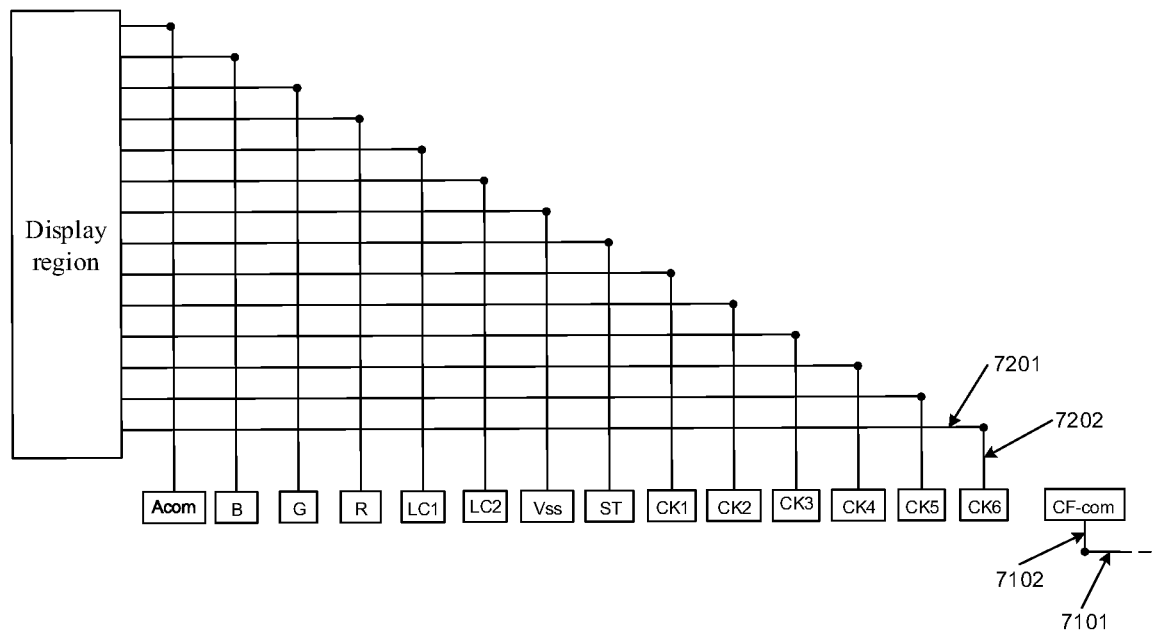
FIG. 7 is a schematic diagram illustrating a peripheral alignment wire of a first embodiment of the array substrate of the present disclosure.

Specifically, referring to FIG. 7, FIG. 7 is a schematic diagram of peripheral alignment wires of the first embodiment of the array substrate of the present disclosure. The alignment wires may include a main wire (7101, 7201, etc.) and a connection wire (7102, 7202, etc.), and the main wires (7101, 7201, etc.) are arranged in a first direction and extend in a second direction, while the connection wires (7102, 7202, etc.) may be arranged in the second direction and extend in the first direction, with the first direction perpendicular to the second direction. A first arrangement direction relative to the alignment pad region of the main wires in the high potential wiring region may be opposite to a second arrangement direction relative to the alignment pad region of the main wires in the low potential wiring region, and a first extension direction relative to the alignment pad region of the main wire in the high potential wiring region may be opposite to a second extension direction relative to the alignment pad region of the main wire in the low potential wiring region.

In the situation shown in FIG. 7, the main wires (7101, 7201, etc.) can be arranged in a vertical direction and extend in a horizontal direction, and the connection wires (7102, 7202, etc.) can be arranged in the horizontal direction and extend in the vertical direction. Herein, a pad CF-corn is configured to access a high potential signal, and correspondingly connects to the alignment wire in the high potential wiring region; a pad A-corn, clock pads CK1, CK2, CK3, CK4, CK5, CK6 . . . CKn, low frequency clock pads LC1, LC2, a start signal pad ST, a common voltage pad Vss, and data signal voltage pads R, G, B are configured to access a low potential signal, and correspondingly connect to the alignment wires in the low potential wiring region. The main wires (7201, etc.) in the low potential wiring region can be arranged upwards in the vertical direction and extend leftwards in the horizontal direction; while the main wire (7101) in the high potential wiring region can be arranged downwards in the vertical direction and extend rightwards in the horizontal direction. As mentioned above, the first arrangement direction of the main wires in the high potential wiring region and the second arrangement direction of the main wires in the low potential wiring region are opposite, and the first extension direction of the main wires in the high potential wiring region and the second extension direction of the main wires in the low potential wiring region are also opposite.

In another embodiment, the first arrangement direction of the main wires in the high potential wiring region may be opposite to the second arrangement direction of the main wires in the low potential wiring region as the above embodiment, but the first extension direction of main wires in the high potential wiring region may be the same as the second extension direction of the main wires in the low potential wiring region. That is, the main wire 7101 in FIG. 7 can also extend leftwards in the horizontal direction.

Alternatively, in one embodiment, the partition with a small number of alignment wires in the alignment wiring region may be disposed on one position away from the display region. In this way, the edge film formation assurance region can be protected from being affected. Herein, when the number of the alignment wires in the high potential wiring region is smaller than the number of the alignment wires in the low potential wiring region, the high potential wiring region can be configured on a position farther from the display region, while the low potential wiring region can be configured on a position closer to the display region. On the contrary, when the number of alignment wires in the high potential wiring region is greater than the number of alignment wires in the low potential wiring region, the high potential wiring region can be configured on the position closer to the display region, and the low potential wiring region can be configured on the position farther from the display region.

Figure 8:
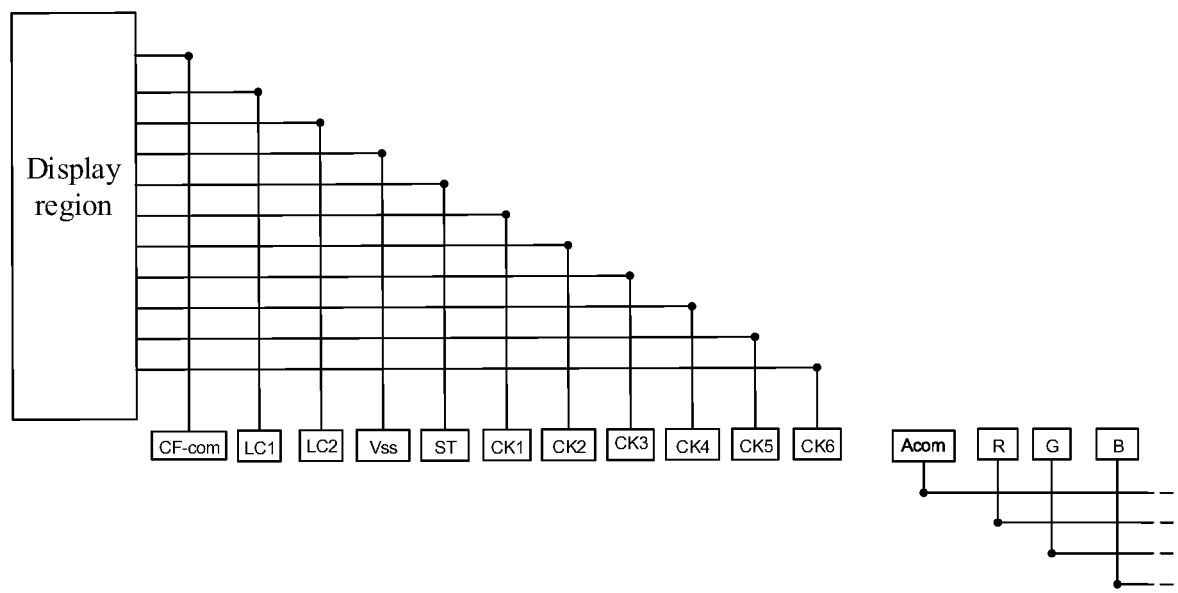
FIG. 8 is a schematic diagram illustrating a peripheral alignment wire of a second embodiment of the array substrate of the present disclosure.

Specifically, referring to FIG. 8, FIG. 8 is a schematic diagram of a peripheral alignment wire of the second embodiment of the array substrate of the present disclosure. In the situation shown in FIG. 8, the pads CF-com, the clock pads CK1, CK2, CK3, CK4, CK5, CK6, . . . CKn, the low frequency clock pads LC1, LC2, the start signal pad ST, and the common voltage pad Vss may be configured to access a high potential signal, and correspondingly connect to the alignment wires in the high potential wiring region; the pad A-com, and the data signal voltage pads R, G, B may be configured to access the low potential signal, and correspondingly connect to the alignment wires in the low potential wiring region. Herein, the number of the alignment wires in the high potential wiring region is greater than the number of the alignment wires in the low potential wiring region, so the high potential wiring region can be disposed more closely to the display region, which is contrary to the situation shown in FIG. 7.

Figure 9:
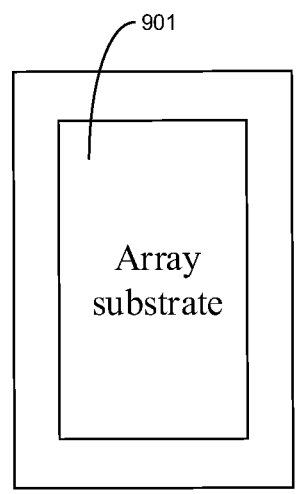
FIG. 9 is a schematic structural diagram of a first embodiment of a display panel of the present disclosure.

The present disclosure also provides a display panel. Referring to FIG. 9, FIG. 9 is a schematic diagram of a first embodiment of the display panel of the present disclosure. In this embodiment, the display panel 90 may include an array substrate 901. The array substrate 901 may include a display region and a non-display region. The non-display region may include an alignment wiring region and an alignment pad region. The alignment wiring region may be provided with a plurality of alignment wires and including a high potential wiring region and a low potential wiring region. And the alignment pad region may be provided with a plurality of alignment pads grouped into a high potential pad and a low potential pad. And each alignment pad electrically connects to a corresponding alignment wire. The high potential wiring region may be disposed on one side of the alignment pad region, and the low potential wiring region may be located on an opposite side of the alignment pad region. The alignment wire corresponding to the high potential pad can be disposed in the high potential wiring region, and the alignment wire corresponding to the low potential pad can be disposed in the low potential wiring region. The specific structural features and beneficial effects of the array substrate 901 are the same as those in the above embodiments of the array substrate. Details refer to the description of the above embodiments, and are not described herein again.

Figure 10:
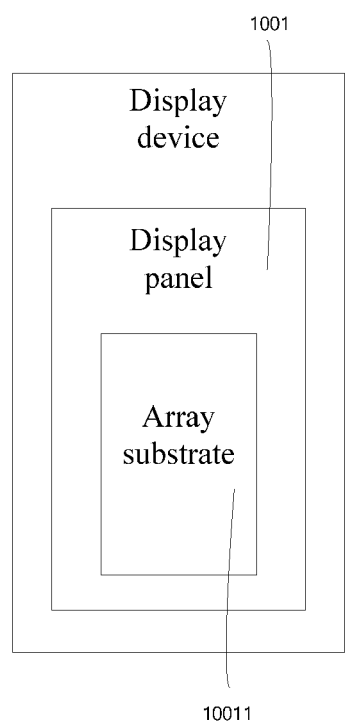
FIG. 10 is a schematic structural diagram of a first embodiment of a display device of the present disclosure.

The present disclosure further provides a display device. Referring to FIG. 10, FIG. 10 is a schematic diagram of a first embodiment of a display device according to the present disclosure. In this embodiment, the display device 100 may include a display panel 1001. The display panel 1001 may include an array substrate 10011. The array substrate 10011 may include a display region and a non-display region. The non-display region may include an alignment wiring region and an alignment pad region. The alignment wiring region may be provided with a plurality of alignment wires and including a high potential wiring region and a low potential wiring region. And the alignment pad region may be provided with a plurality of alignment pads grouped into a high potential pad and a low potential pad. And each alignment pad electrically connects to a corresponding alignment wire. The high potential wiring region may be disposed on one side of the alignment pad region, and the low potential wiring region may be located on an opposite side of the alignment pad region. The alignment wire corresponding to the high potential pad can be disposed in the high potential wiring region, and the alignment wire corresponding to the low potential pad can be disposed in the low potential wiring region. The specific structural features and beneficial effects of the array substrate are the same as those in the above embodiments of the array substrate. Details refer to the description of the above embodiments, and are not described herein again.

According to the above solution, in the array substrate provided by the present disclosure, by partitioning the alignment wires according to the potential level, the alignment wires with similar potentials can be disposed in the same region to avoid the cross-line region with a large potential difference being generated, which can decrease the electrostatic short circuit phenomenon and improve the electrostatic protection capability of the product.

The above description merely illustrates some exemplary embodiments of the disclosure, which however are not intended to limit the scope of the disclosure to these specific embodiments. Any equivalent structural or flow modifications or transformations made according to the specification and figures in the present disclosure, or any direct or indirect applications of the disclosure on any other related fields, shall all fall in the scope of the disclosure.

What is claimed is:

1. An array substrate comprising:
   a display region; and
   a non-display region, comprising:
      a plurality of alignment wires comprising a high potential alignment wire and a low potential alignment wire; and
      a plurality of alignment pads comprising a high potential pad and a low potential pad;
   wherein the high potential alignment wire is electrically connected to the high potential pad and the low potential alignment wire is electrically connected to the low potential pad, the high potential alignment wire is disposed on a first side of the plurality of alignment pads and the low potential alignment wire is disposed on a second side of the plurality of alignment pads; and the high potential alignment wire has a first orthogonal projection on the plurality of alignment pads, the low potential alignment wire has a second orthogonal projection on the plurality of alignment pads, and the first orthogonal projection and the second orthogonal projection do not overlap with each other;
   and when the number of high potential alignment wires is smaller than the number of low potential alignment wires, the high potential alignment wire is disposed farther from the display region than where the low potential alignment wire is disposed;
   and when the number of high potential alignment wires is greater than the number of low potential alignment wires, the high potential alignment wire is disposed closer to the display region than where the low potential alignment wire is disposed; and
   wherein the plurality of alignment pads comprises a set of color film substrate common voltage pads configured to input a common voltage of a color filter substrate, a set of array substrate common voltage pads configured to input a common voltage of an array substrate, a set of clock pads configured to input a clock signal, a set of low frequency clock pads configured to input a low frequency clock signal, a set of start signal pads configured to input a start signal, a set of common voltage pads configured to input a common terminal voltage, and a set of data signal voltage pads configured to input a pixel electrode data signal voltage.

2. The array substrate according to claim 1, wherein the plurality of alignment wires comprising:
   a main wire arranged in a first direction and extending in a second direction; and
   a connection wire arranged in the second direction and extending in the first direction;
   wherein the first direction is perpendicular to the second direction, and a first arrangement direction relative to the plurality of alignment pads of the main wire corresponding to the high potential alignment wire is opposite to a second arrangement direction relative to the plurality of alignment pads of the main wire corresponding to the low potential alignment wire, and a first extension direction relative to the plurality of alignment pads of the main wire corresponding to the high potential alignment wire is opposite to a second extension direction relative to the plurality of alignment pads of the main wire corresponding to the low potential alignment wire.

3. The array substrate according to claim 1, wherein the plurality of alignment wires comprising:
   a main wire arranged in a first direction and extending in a second direction; and
   a connection wire arranged in the second direction and extending in the first direction;
   wherein the first direction is perpendicular to the second direction, and a first arrangement direction relative to the plurality of alignment pads of the main wire corresponding to the high potential alignment wire is opposite to a second arrangement direction relative to the plurality of alignment pads of the main wire corresponding to the low potential alignment wire, and a first extension direction relative to the plurality of alignment pads of the main wire corresponding to the high potential alignment wire is the same with a second extension direction relative to the plurality of alignment pads of the main wire corresponding to the low potential alignment wire.

4. The array substrate according to claim 1, wherein the alignment wiring region is provided with a first metal layer, an insulating layer, and a second metal layer, the insulating layer defines a through-hole, and the plurality of alignment wires comprises a main wire and a connection wire, with the main wires disposed on the first metal layer, and the connection wires disposed on the second metal layer, and the alignment wires of the first metal layer and the alignment wires of the second metal layer are electrically connected through the through-hole.

5. An array substrate, comprising:
a display region; and
a non-display region, comprising:
   a plurality of alignment wires comprising a high potential alignment wire and a low potential alignment wire; and
   a plurality of alignment pads comprising a high potential pad and a low potential pad;
   wherein the high potential alignment wire is electrically connected to the high potential pad and the low potential alignment wire is electrically connected to the low potential pad, the high potential alignment wire is disposed on a first side of the plurality of alignment pads and the low potential alignment wire is disposed on a second side of the plurality of alignment pads; and
   wherein the plurality of alignment pads comprises a set of color film substrate common voltage pads configured to input a common voltage of a color filter substrate, a set of array substrate common voltage pads configured to input a common voltage of an array substrate, a set of clock pads configured to input a clock signal, a set of low frequency clock pads configured to input a low frequency clock signal, a set of start signal pads configured to input a start signal, a set of common voltage pads configured to input a common terminal voltage, and a set of data signal voltage pads configured to input a pixel electrode data signal voltage.

6. The array substrate according to claim 5, wherein the high potential alignment wire has a first orthogonal projection on the plurality of alignment pads, the low potential alignment wire has a second orthogonal projection on the plurality of alignment pads, and the first orthogonal projection and the second orthogonal projection do not overlap with each other.

7. The array substrate according to claim 6, wherein the plurality of alignment wires comprising:
a main wire arranged in a first direction and extending in a second direction; and
a connection wire arranged in the second direction and extending in the first direction;
wherein the first direction is perpendicular to the second direction, and a first arrangement direction relative to the plurality of alignment pads of the main wire corresponding to the high potential alignment wire is opposite to a second arrangement direction relative to the plurality of alignment pads of the main wire corresponding to the low potential alignment wire, and a first extension direction relative to the plurality of alignment pads of the main wire corresponding to the high potential alignment wire is opposite to a second extension direction relative to the plurality of alignment pads of the main wire corresponding to the low potential alignment wire.

8. The array substrate according to claim 6, wherein the plurality of alignment wires comprising:
a main wire arranged in a first direction and extending in a second direction; and
a connection wire arranged in the second direction and extending in the first direction;
wherein the first direction is perpendicular to the second direction, and a first arrangement direction relative to the plurality of alignment pads of the main wire corresponding to the high potential alignment wire is opposite to a second arrangement direction relative to the plurality of alignment pads of the main wire corresponding to the low potential alignment wire, and a first extension direction relative to the plurality of alignment pads of the main wire corresponding to the high potential alignment wire is the same with a second extension direction relative to the plurality of alignment pads of the main wire corresponding to the low potential alignment wire.

9. The array substrate according to claim 5, wherein the number of high potential alignment wires is smaller than the number of low potential alignment wires, and the high potential alignment wire is disposed farther from the display region than where the low potential alignment wire is disposed.

10. The array substrate according to claim 5, wherein the number of high potential alignment wires is greater than the number of low potential alignment wires, and the high potential alignment wire is disposed closer to the display region than where the low potential alignment wire is disposed.

11. The array substrate according to claim 5, wherein the alignment wiring region is provided with a first metal layer, an insulating layer, and a second metal layer, the insulating layer defines a through-hole, and the plurality of alignment wires comprises a main wire and a connection wire, with the main wires disposed on the first metal layer, and the connection wires disposed on the second metal layer, and the alignment wires of the first metal layer and the alignment wires of the second metal layer are electrically connected through the through-hole.

12. A display panel, comprising:
an array substrate, comprising:
   a display region; and
   a non-display region, comprising:
      a plurality of alignment wires comprising a high potential alignment wire and a low potential alignment wire; and
      a plurality of alignment pads comprising a high potential pad and a low potential pad;
      wherein the high potential alignment wire is electrically connected to the high potential pad and the low potential alignment wire is electrically connected to the low potential pad, the high potential alignment wire is disposed on a first side of the plurality of alignment pads and the low potential alignment wire is disposed on a second side of the plurality of alignment pads; and wherein the plurality of alignment pads comprises a set of color film substrate common voltage pads configured to input a common voltage of a color filter substrate, a set of array substrate common voltage pads configured to input a common voltage of an array substrate, a set of clock pads configured to input a clock signal, a set of low frequency clock pads configured to input a low frequency clock signal, a set of start signal pads configured to input a start signal, a set of common voltage pads configured to input a common terminal voltage, and a set of data signal voltage pads configured to input a pixel electrode data signal voltage.

13. The display panel according to claim 12, wherein the high potential alignment wire has a first orthogonal projection on the plurality of alignment pads, the low potential alignment wire has a second orthogonal projection on the plurality of alignment pads, and the first orthogonal projection and the second orthogonal projection do not overlap with each other.

14. The display panel of claim 13, wherein the plurality of alignment wires comprising:
a main wire arranged in a first direction and extending in a second direction; and
a connection wire arranged in the second direction and extending in the first direction;
wherein the first direction is perpendicular to the second direction, and a first arrangement direction relative to the plurality of alignment pads of the main wire corresponding to the high potential alignment wire is opposite to a second arrangement direction relative to the plurality of alignment pads of the main wire corresponding to the low potential alignment wire, and a first extension direction relative to the plurality of alignment pads of the main wire corresponding to the high potential alignment wire is opposite to a second extension direction relative to the plurality of alignment pads of the main wire corresponding to the low potential alignment wire.

15. The display panel according to claim 13, wherein the plurality of alignment wires comprising:
a main wire arranged in a first direction and extending in a second direction; and
a connection wire arranged in the second direction and extending in the first direction;
wherein the first direction is perpendicular to the second direction, and a first arrangement direction relative to the plurality of alignment pads of the main wire corresponding to the high potential alignment wire is opposite to a second arrangement direction relative to the plurality of alignment pads of the main wire corresponding to the low potential alignment wire, and a first extension direction relative to the plurality of alignment pads of the main wire corresponding to the high potential alignment wire is the same with a second extension direction relative to the plurality of alignment pads of the main wire corresponding to the low potential alignment wire.

16. The display panel according to claim 12, wherein the number of high potential alignment wires is smaller than the number of low potential alignment wire, and the high potential alignment wire is disposed farther from the display region than where the low potential alignment wire is disposed.

17. The display panel according to claim 12, wherein the number of high potential alignment wires is greater than the number of low potential alignment wires, and the high potential alignment wire is disposed closer to the display region than where the low potential alignment wire is disposed.

18. The array substrate according to claim 12, wherein the alignment wiring region is provided with a first metal layer, an insulating layer, and a second metal layer, the insulating layer defines a through-hole, and the plurality of alignment wires comprises a main wire and a connection wire, with the main wires disposed on the first metal layer, and the connection wires disposed on the second metal layer, and the alignment wires of the first metal layer and the alignment wires of the second metal layer are electrically connected through the through-hole.

* * * * *